United States Patent [19]

Taeuber et al.

[11] 4,241,331
[45] Dec. 23, 1980

[54] REMOTE CONTROL SYSTEM WITH PROPORTIONAL VALUE TRANSMISSION

[75] Inventors: Reinhard Taeuber, Germering; Hans Neumayr, Hilgertshausen, both of Fed. Rep. of Germany

[73] Assignee: Siemens Aktiengesellschaft, Berlin & Munich, Fed. Rep. of Germany

[21] Appl. No.: 83,389

[22] Filed: Oct. 10, 1979

[30] Foreign Application Priority Data

Nov. 6, 1978 [DE] Fed. Rep. of Germany ....... 2848061

[51] Int. Cl.³ .............................................. H04Q 9/00
[52] U.S. Cl. ................................ 340/167 R; 340/695; 340/696
[58] Field of Search ................. 340/167 R, 695, 696; 358/194.1

[56] References Cited

FOREIGN PATENT DOCUMENTS 2433030  2/1976  Fed. Rep. of Germany .
2653179  5/1978  Fed. Rep. of Germany .

OTHER PUBLICATIONS

Elektronic (1970), vol. 11, pp. 395-396.

Primary Examiner—Harold I. Pitts
Attorney, Agent, or Firm—Hill, Van Santen, Steadman, Chiara & Simpson

[57] ABSTRACT

In a remote control system, for example for the adjustment of a television set or a radio set, at least one portion of the commands to be transmitted is determined by an analog setting. To this end, the transmitter is selectively operated to transmit a binary code word characterizing the command and analog information is provided by adjusting the time interval between the code word and the next following code word. The second code word may be identical to the first code word, in which case the code word is repeated at selected intervals. The second code word could also be an individual pulse. The receiving system includes a decoder for identifying the command and an analog sensing circuit for terminating the command in response to the adjusted time interval between code words.

9 Claims, 6 Drawing Figures

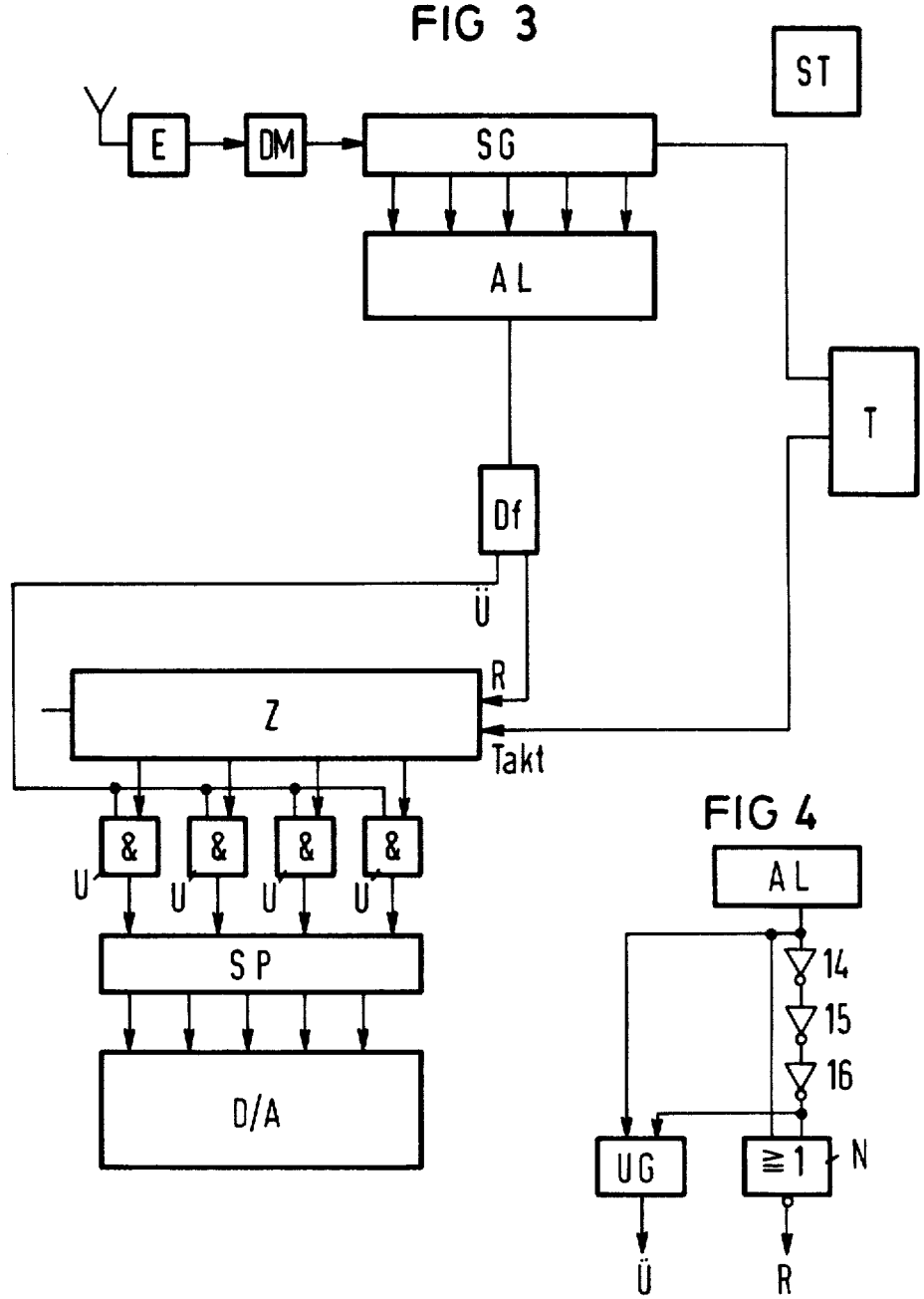

REMOTE CONTROL SYSTEM WITH PROPORTIONAL VALUE TRANSMISSION

BACKGROUND OF THE INVENTION

1. Field of the Invention

The present invention relates to a remote control system, having a transmitter and a receiver, in which a random remote control command from a prescribed command supply of remote control commands to be transmitted is respectively transmittable in the form of a digital word characterizing the command from the sender to the receiver which is responsive to the command, in which there is provided a pulse generator in the transmitter which is adjustable via a system serving for command selection, for generating a digital word to be transmitted to the receiver, and a decoder is provided in the receiver which, on the basis of the digital word received, relays the pertinent information contained in the digital word to an element for executing the command.

2. Description of the Prior Art

A remote control system of the type generally described above is set forth in the publication "Elektronik" (1970), Vol. 11, pp. 395 and 396.

In remote control systems as are employed, for example, for the remote control of television receivers or radio receivers, the task of undertaking a change of a continuously variable adjustment parameter at the remotely-controlled device is conventional. In known remote control systems, a plus key and a minus key are provided for this purpose, with whose assistance the respective direction of the change to be undertaken can be set at the transmitter of the remote control system. The degree of change is left up to personal discretion upon the operation of the remote control system. The final adjustment of the respective adjustment element at the remotely-controlled device can be perceived at the device, but not at the transmitter of the remote control system. It would therefore be desirable to have a remote control system available which provides an adjustment value display, i.e. the display of the respective adjustment of the remotely-controlled adjustment element, at the transmission side of the remote control system.

The German published application No. 24 33 030 and the German published application No. 26 53 179 are considered as prior art in this area.

SUMMARY OF THE INVENTION

The object of the present invention is to provide a remote control system which provides an adjustment value display and which differs significantly from the aforementioned German published applications.

To this end, a remote control system of the type generally set forth above is designed, according to the present invention, in such a manner that a pulse generator is provided which, in addition to generating the digital word characterizing the command to be undertaken, is also operated to generate a further digital signal following the digital word at a temporal distance adjustable via a command selection system. In addition, a sensor is provided in the receiver which responds to the temporal distance between the characterizing digital word and the further digital signal for the control of an analog adjusting operation at the device to be controlled by way of the remote control system, the adjusting operation being connected with the execution of the command defined with the characterizing digital signal.

The volume in a radio receiver which is remotely controlled by means of such a system, for example, is one example of an application of the invention. Due to the design of the system, the characterizing digital word is connected with the command that the volume is to be increased, whereas the interval between the digital word and the following digital signal forms a measure for the adjustment respectively to be applied to the adjustment allocated to the command at the remote control radio receiver, for example in such a manner that the degree of the volume change is proportional to the length of the interval between the digital word and the following digital signal.

The command selection system is essentially designed to a standard manner. Accordingly, switches, particularly push button switches, are assigned to the individual commands and occasion the activation of the system when operated to their closed states, i.e activation of the pulse generator and of the transmitter for relaying the command to the receiver. Upon opening the switch, on the other hand, generally not only the transmission of the code word characterizing the command is terminated, but, rather, the system is at the same time again shut off.

There is the possibility of fixing the command supply provided in the total for transmission in the remote control system in an appropriate read only memory (ROM) which is then interrogated for the digital word assigned to the depressed selection switch via an appropriate decoder by means of a respective signal assigned to respective ones of the selection switches and generated only upon actuation of the respective switch. Frequently, however, the command selection is also provided by way of the coupling field whose coupling points are activated in accordance with the digital command word to be generated by means of the individual selection switches in such a manner that the desired code word is formed upon a clock pulse interrogation of the coupling field wired in this manner in response to clock pulse signals.

The system for generating the digital word fixing the nature of the command to be executed in the system is designed in the present case, in a standard manner, as are the transmitter and the decoding system for decoding and relaying the command from the received digital word in the receiver. On the other hand, it is particularly unique that the system provides a second digital signal to be generated at a freely selectable temporal distance from the actual command word, which second digital signal is recognized by the receiver as an information belonging to the command respectively transmitted and is relayed by the decoder in the same manner as the primary code word to the same element which completes the execution of the command.

Usually, the system is designed in such a manner that the primary code word and the second digital signal are beamed in pairs to the receiver at regular intervals until an answer back from the receiver exists concerning the completion of the execution of the command.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a schematic block diagram of a receiver for use with the system illustrated in FIG. 1;

FIG. 4 is a schematic block diagram of an embodiment of a part of the receiver of FIG. 3.

DESCRIPTION OF THE PREFERRED EMBODIMENTS

In a first embodiment of a device constructed in accordance with the present invention, it is provided that the code word characterizing the command is repeated at adjustable intervals and that the adjusted interval is employed as analog information upon the execution of the command defined by the code word. The transmitter of the system suited for this purpose is described below with reference to FIGS. 1 and 2, and the receiver of such a system is described below with reference to FIGS. 3 and 4.

In general, such a system is based on the following principle.

The temporal interval between the first code word and the second code word which is identical to the first code word is controlled by way of an adjustable RC circuit of a monoflop, which is triggered with each transmission period. The change of the logic state, which is connected with the return of the monoflop into the initial position, triggers a new transmission cycle in the transmitter via a reset function. The analog value for the control of the execution of the command transmitted, thereby, can be transmitted without significant delay by means of the time interval of two successive code words, whereby the information which is just being transmitted by a plurality of analog values can be determined by means of the coding in the digital word.

The evaluation of the transmitted analog value on the receiving side occurs by means of counting the word interval, whereby the resolution or quantization of the analog value is determined by means of a counter clock pulse frequency on the receiver side. If the transmission and the succeeding digital/analog conversion are in a linear relationship, then the temporal course of the characteristic curve of the digital/analog converter employed is determined by means of the RC characteristic of the adjustment control on the transmitter side. Therefore, a logarithmic characteristic curve of the D/A converter on the receiver side can be realized with a logarithmic potentiometer forming the resistor of the RC circuit in the monoflop on the transmitter side, so that the adjustment of the potentiometer may at the same time be evaluated as the display of the adjustment of the operating part to be controlled on a analog basis at the device to be adjusted via the remote control system. Expensive operating displays are therefore superfluous.

The potentiometer effecting the adjustment of the RC value of the monoflop in the transmitter can, for example, be designed as a shift register such that a shift operation can only be executed when a locking (interleaving is triggered by pressing the control button perpendicular to the shift direction. Thereby, the control button at the same time forms the push button which is assigned to the command in the transmitter and which, upon actuation, activates those circuit parts in the transmitter which effect the realization of the code word characterizing the selected command.

Figure 1:
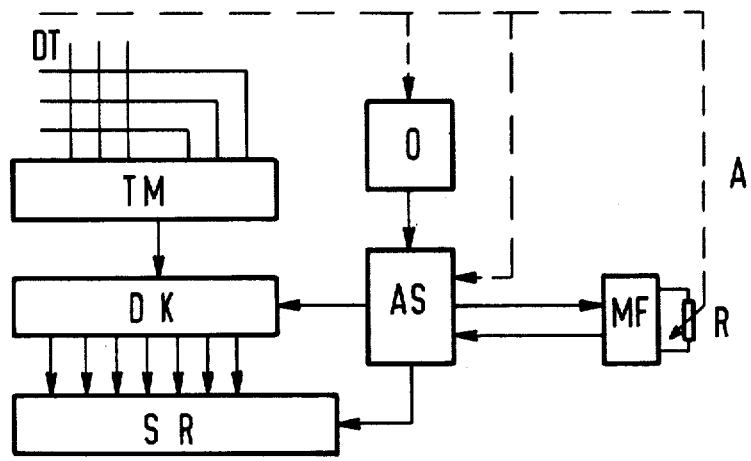
FIG. 1 is a schematic block diagram of a transmission system of a device constructed in accordance with the present invention in which the code word characterizing a command to be transmitted is repeated at an adjustable interval.

In the transmission system illustrated in FIG. 1, the command selection is provided by means of a keyboard matrix TM, in which command selection the information to be transmitted to the receiver is generated and stored until the push button DT is operated. This information is input in parallel via a decoder DK into a shift register SR which is driven by a clock pulse generator O. The information received by the shift register SR and forming the binary word to be transmitted is serially read and is employed via a modulator for keying the transmitter, for example an infrared or ultra-high frequency transmitter or ultrasonic transmitter. (The modulator and the transmitter are not illustrated in FIG. 1.)

A sequence control AS sees to it that, when the command key DT is still depressed, the decoder DK again transmits the information stored in the memory field of the keyboard matrix TM to the shift register SR after termination of a time interval, whereby a fixed period is provided in the standard arrangements.

In the present embodiment of a device constructed in accordance with the present invention, however, the interval between two successive interrogations of the memory content of the keyboard matrix TM is adjustable within a predetermined time interval by way of a device which is to be manually operated, for example a slide or a tuning knob.

This time interval is provided by means of a RC-controlled monoflop MF having an adjustable RC time constant, whereby, as mentioned above, at least one portion of the resistance of the RC circuit is provided in the form of a potentiometer R, particularly a potentiometer having a logarithmic characteristic curve. If the adjustment device is designed as a rotatable knob, then, as already mentioned, it can be entrusted without further ado with the job of command selection by means of a design as a rotatable push button. Otherwise, a separate rotatable knob can be provided for the analog adjustment or intensity control in the command transmission. By way of such an analog adjustment, the time constant of the monoflop MF and, therefore, the time interval between the control pulse supplied by the sequence control AS and setting the monoflop MF and the pulse supplied by the monoflop MF due to the spontaneous return into its initial position is set. The last-mentioned pulse serves to cause the sequence control AS to undertake a renewed interrogation of the keyboard matrix TM via the decoder DK. If the setting of the rotatable knob remains unchanged, then the interrogation operation is repeated with a period fixed by means of the position of the knob.

In order to realize these functions, various embodiments of the sequence control AS are possible, whereby, advantageously, a binary counter having a plurality of counter stages is provided each time, the counting input of this binary counter being charged by clock pulses supplied by the clock pulse generator O.

In the following, an exemplary embodiment will be described on the basis of FIG. 2.

A binary counter comprising n counter stages $Z_1$, $Z_2$, ... $Z_{n-1}$, $Z_n$ connected in series, the counter stages being in the form of identical flip-flop cells each having a reset input, for example in the form of toggle flip-flop cells, are charged at a counting input, i.e. at the first counter stage $C_1$, by means of the clock pulses emitted by the clock pulse generator O. The Q output of the first counter stage $Z_1$ and the Q output of the second counter stage $Z_2$ are connected to respective inputs of an AND gate $G_1$ which emits a pulse as soon as a logic "1" is available at the two Q outputs ($Q_1$, $Q_2$) of the stages $Z_1$ and $Z_2$. By means of the pulse emitted by the AND gate $G_1$, the monoflop MF is set, which in turn emits a pulse depending on the RC time constant which has been set. The maximum RC time of the monoflop which can be set is at most equal to the time which the clock pulse generator O requires in order to switch the counter up to the last counter stage $Z_n$.

If the signal output of the monoflop MF changes state from a logic "1" to a logic "0", then a reset pulse for the binary counter comprising the cells is obtained by means of a digital differentiating circuit, to reset all of the counter stages $Z_n-Z_n$. In the exemplary embodiment illustrated in FIG. 2, the differentiating circuit comprises an OR gate $G_2$ having two inputs, whose signal output is connected to the reset inputs of the counter stages $Z_1-Z_n$ and, moreover, is provided for the auxiliary control of the decoder DK, whereas the two inputs of the OR gate $G_2$ are charged by means of the signal of the monoflop MF. For this purpose, one input of the gate $G_2$ is directly connected to receive the output signal of the monoflop MF and the other input is connected to the mono-flop MF by way of a series of three inverters $I_1$, $I_2$ and $I_3$.

In addition, the total circuit is laid out in a known manner such that, upon actuation of a command selection key DT, not only is the oscillator O activated, but a reading of the information content of the memory field of the keyboard matrix TM, which arose by means of the actuation of the push button DT, is spontaneously provided. For further operation, this part of the control system AS is then deactivated and the further sequence is under the control of that portion of the sequence control AS illustrated in FIG. 2. As can be seen from FIG. 3, for example, the signal sequences picked up by the receiver E are first converted via a demodulator DM into binary form and are serially read into a shift register SG. An evaluation logic circuit AL receives the fully stored information in response to a control pulse supplied by a sequence control system ST.

The received binary word is now checked in the evaluation logic circuit AL and, depending on the result of the test, a distributor, designed as a demultiplexer, for example, is switched in accordance with the code word characterizing the transmitted command, so that the portion of the transmitted signal triggering the execution of the command is fed to the element which is to undertake the execution. A clock pulse generator T supplies the shift clock pulse for the shift register SG and, under certain conditions, also for the co-control of the evaluation logic circuit AL.

The components of the receiver according to FIG. 3 described up to this point, as well as the portion serving for activation thereof on the basis of a signal supplied by the transmitter, can be presumed as well known in the art and require no further description.

A counter Z, controlled by the clock pulse generator T, is charged at its reset inputs via a digital differential element Df by means of the digital signal supplied by the evaluation logic circuit AL in the same manner as the distributor. Given the presence of a digital pulse, the counter Z is reset each time so that no counter reading can build up because of the clock pulse signal supplied to the counting input of the counter Z. This is only possible after the decay of the last pulse of the code word received. When the code word appears the next time, then a continuous resetting of the counter reading into the initial position again occurs. The counter reading of the counter Z last attained and, therefore, corresponding to the time intervals between two succeeding binary words corresponds to the analog information set via the potentiometer R at the monoflop MF in the transmitter and requires, in addition to conversion into an appropriate analog signal, relaying via a digital-/analog converter D/A to the location controlling the execution of the command.

In order to accomplish this, the counter reading being built up in the counter Z is taken over by a memory SP which then relays the counting result, i.e. the analog value transmitted, via the distributor mentioned above (not illustrated) to the location controlling the execution of the command after conversion into an analog signal.

To this end, for example, the signal appearing at the signal output of the evaluation logic circuit AL can be employed on one hand for resetting the counter Z and, on the other hand, for the control of the transfer of the counter reading to the memory SP (if needed, also for the control of the clock pulse supply of the memory SP). In order to achieve this, the signal appearing at the output of the evaluation logic circuit AL is applied to the reset input of the counter Z via the differentiation element Df (if necessary, a delay element). On the other hand, the design is such that, given a minimum delay, the signal appearing at the output of the evaluation logic circuit AL controls the transfer of the counter content to the memory SP and, if necessary, to the relaying of the memory content to the evaluation location, i.e. to the digital/analog converter D/A.

To this end, as can be seen from FIG. 3, one can apply an output of the digital differentiating circuit Df to the reset input of the counter Z which is constructed in such a manner that the reset signal has priority. On the other hand, a plurality of AND gates U each having two signal inputs is provided, the number of gates corresponding to the number of counter stages of the counter Z and, therefore, to the plurality of the memory stages of the memory SP which is provided for receiving the resulting count. Thereby, the signal appearing at the second signal output of the digital differentiating circuit Df is applied to one signal input of each of the AND gates U, whereas the other signal input of the AND gates U is charged by means of a respective output of the counter Z. Finally, the output of the AND gate U concerned is connected to the signal input of the memory cell of the memory SP which is respectively assigned thereto.

The task of the differentiating circuit is to supply two separate signals per signal pulse of the signals supplied from the evaluation logic circuit AL, of which two separate signals the first corresponds to the rising edge and the second corresponds to the falling edge of the controlling pulse.

As illustrated in FIG. 4, the digital differentiating circuit Df can comprise, for example, an uneven plurality of inverters $I_4$, $I_5$, $I_6$ by way of which the signal supplied by the evaluation logic circuit AL is applied, time-delayed, to a respective input of an AND gate UG and a NOR gate N. Thereby, the undelayed signal is applied directly to one input of the AND gate UG and to one input of the NOR gate N. These logical linkages of the delayed and undelayed signals supply a pulse R at the NOR gate N at the falling edge of the pulse supplied by the evaluation logic circuit AL and supply a pulse Ü at the AND gate UG at the rising edge.

The signal R supplied from the NOR gate N serves for resetting the counter Z, while the signal Ü supplied from the AND gate UG controls the AND gates U between the counter Z and the memory SP and, therefore, the transfer of the counter reading into the memory SP. The counter reading respectively existing in the memory SP can then be relayed in a known manner, for example by means of parallel reading, to the digital-/analog converter DA and, therefore, to the evaluation location.

The memory SP is designed, for example, as a shift register driven by the clock pulse generator T, whereby, each register cell is charged by a respective AND gate U.

If one wishes to have a serial reading of the content of the memory SP by means of the clock pulses supplied by the clock pulse generator T, then (not illustrated on the drawings) one can apply the clock pulse to the clock pulse input of the shift register via the combination of an AND gate with an EXCLUSIVE OR gate. These two gates respectively exhibit two logical inputs, whereby one respective input is driven by the clock pulse generator T, the second input of the EXCLUSIVE OR gate is driven by means of the output of the AND gate and the second input of the AND gate is driven by means of the signal output of the evaluation logic circuit AL. The EXCLUSIVE OR gate is designed in such a manner that the control by means of the last-mentioned AND gate has priority over the control occurring by means of the clock pulse generator T, so that, upon occurrence of a pulse at the signal output of the evaluation logic circuit AL, the clock pulse supplied to the memory SP is interrupted and the counter reading of the counter Z can be transferred without distribution into the memory cells.

The counter reading of the counter Z taken over by the memory SP, as already mentioned above, is transmitted to the digital/analog converter D/A assigned to the command to be executed and then controls the degree to which the command characterized by the code word per se is to be executed.

The embodiment of a device according to the present invention. as described up to this point, can be varied without further ado and without having the essence of the embodiment thereby lost. What is viewed as the essence, as already emphasized above, is the behavior of the transmitter, that the code word characterizing the command is repeated at adjustable intervals and that the receiver is at a position to count the interval and employ the same as information for an analog adjustment for the particular exercise of the command transmitted.

However, there is also the possibility that the second signal serving to also limit the analog information deviates in shape from the code word characterizing the command and, for example, consists of but a single pulse. The interval of this pulse from the preceding command word can be set via a control in a similar manner as the interval of the two code words. For example, there is the possibility that the transmitter system illustrated in FIG. 1 is altered in such a manner that the output of the monoflop MF of FIGS. 1 and 2 is directly employed for the control of the modulator which is connected to the transmitter, so that the pulse emitted upon the return of the activated monoflop MF into its stable condition is available as the limiting signal.

Another advantageous embodiment will now be described on the basis of FIGS. 5 and 6.

Figure 2:
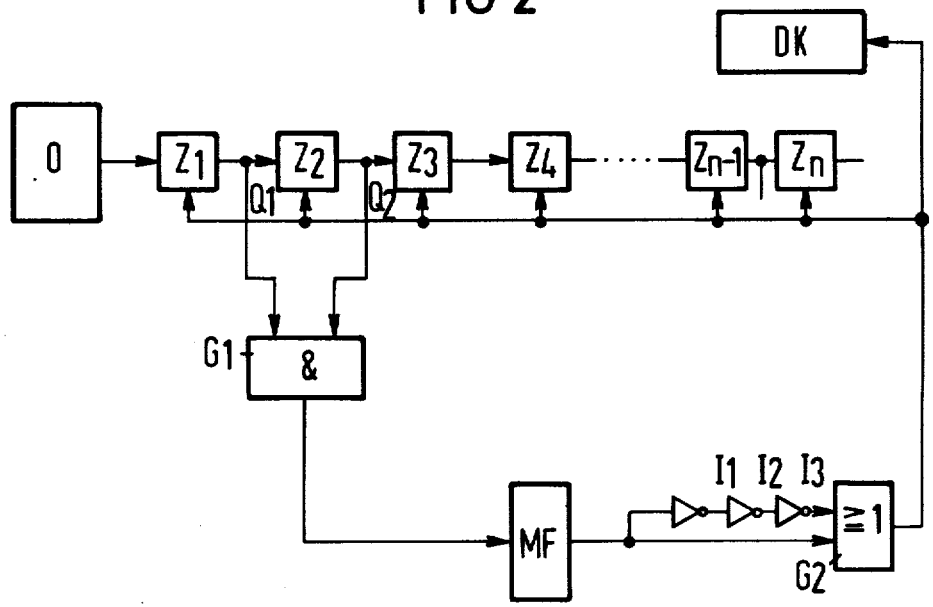
FIG. 2 is a schematic block diagram of a portion of the system illustrated in FIG. 1.
Figure 5:
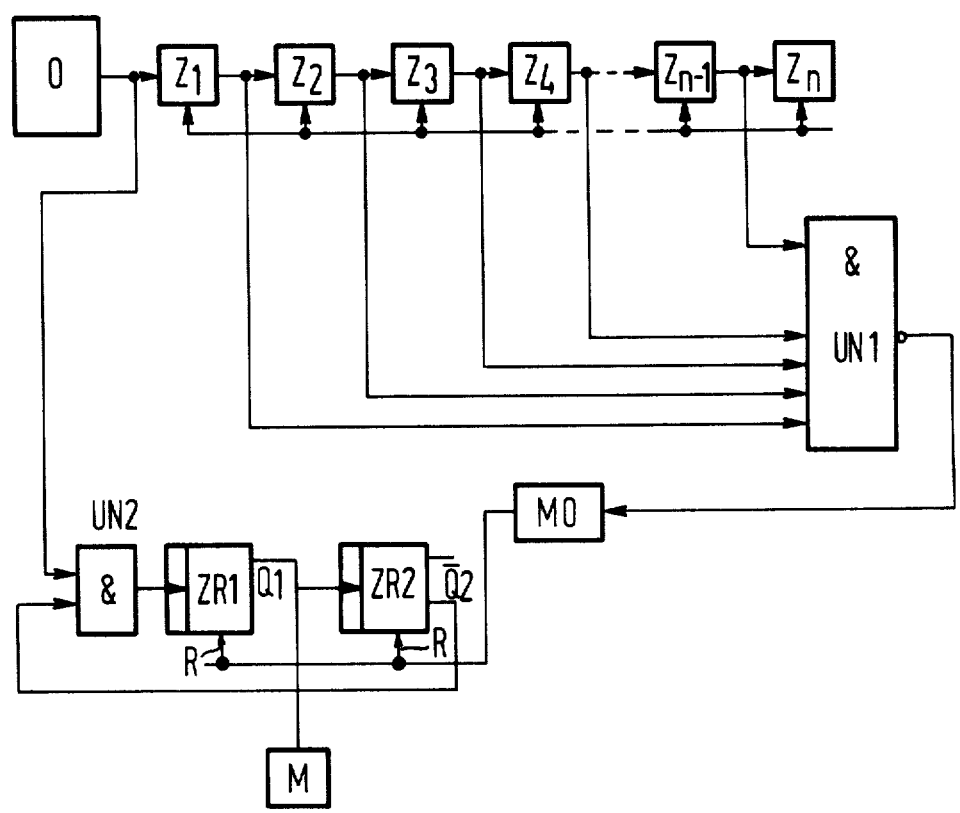
FIGS. 5 and 6 relate to the transmitter and the receiver of the system in which the second pulse of each pulse pair is only provided by means of a binary pulse.

In this case, the system illustrated in FIG. 5 replaces the system illustrated in FIG. 2 in a device according to FIG. 1 and thus corresponds to the sequence control AS with respect to the generation of the analog signal.

In this embodiment, the clock pulse generator O is likewise provided for the control of a binary counter which comprises a plurality of counter stages $Z_1$-$Z_n$. Further, the signal supplied by the clock pulse generator is applied to one input of an AND gate UN2. The individual counting outputs of the first (n−1) counter stages $Z_1$-$Z_{n-1}$ lie at a respective signal input of an AND gate UN1 having a plurality of signal inputs corresponding to the plurality (n−1) of these counter stages. The output of the AND gate UN1 serves for the control of a monoflop MO. A counter comprising two counter stages ZR1 and ZR2 having reset inputs R is controlled at the reset inputs R by means of the signal output of the monoflop MO. The $\bar{Q}$ output ($\bar{Q}_2$) of the second counter stage ZR2 is connected to the second input of the AND gate UN2 mentioned above whose other input is directly controlled by the clock pulse generator O. The signal output $Q\bar{2}$ of the AND gate UN2 is connected to the counting input of the first counter stage ZR1 whose Q output ($Q_1$) is connected to the counting input of the second counter stage ZR2 and, moreover, is connected for controlling the modulator M which is connected ahead of the transmitter (not shown).

Depending on the adjustment of the RC circuit in the monoflop MO, a reset signal is generated by the monoflop MO after an existing excitation by means of the counter reading 111 . . . 1 extending up to and including the next-to-last counter stage $Z_{n-1}$. The clock pulses supplied by the clock pulse generator O only become effective when a signal appears at the $\bar{Q}$ output of the second counter stage ZR2. The pulse respectively appearing at the Q output of the first counter stage ZR1 then serves as the terminating pulse of the analog information.

The terminating pulse must be recognized as such in the receiver system. To this end, the arrangement according to FIG. 3 is advantageously changed in the manner seen in FIG. 6, the change being directed to the portion serving for the generation of the transfer pulses Ü and the reset pulses R.

Figure 6:
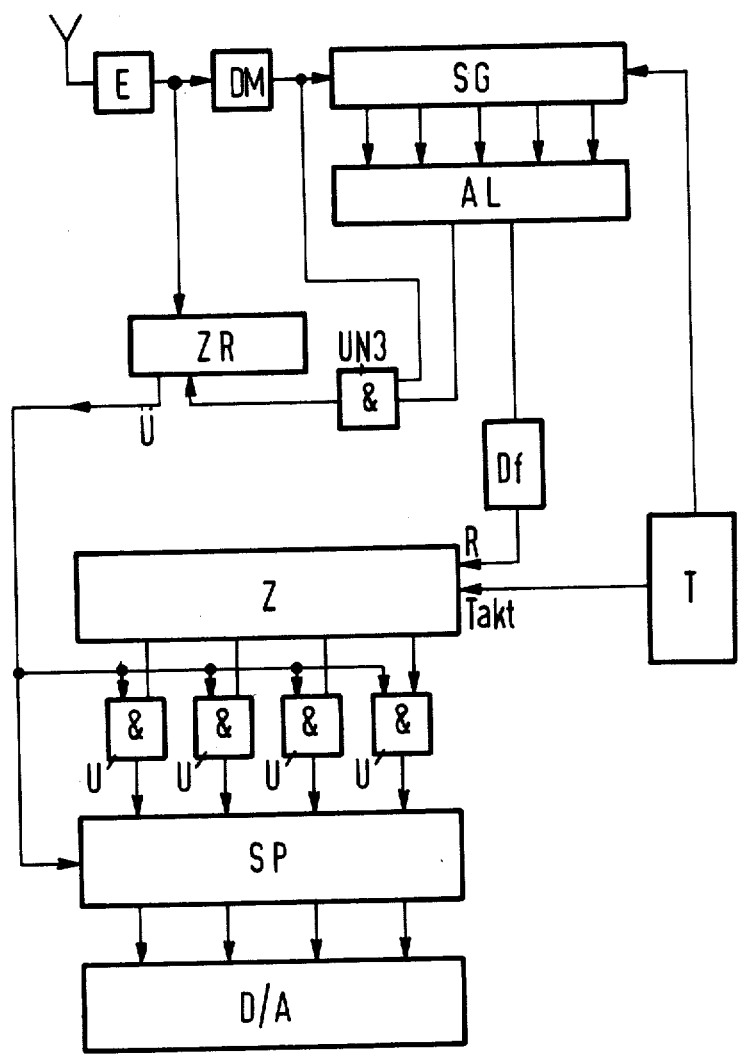

In the circuit of FIG. 6, the input of the demodulator DM following the receiver E is connected with the counting input of a further counter ZR and the output of the demodulator DM is connected with one input of an AND gate UN3. The second input of the AND gate UN3 is controlled by the signal output of the evaluation logic circuit AL, whereas the output of the AND gate UN3 is connected to the reset input of the counter ZR. In this manner, the counter ZR counts the number of carrier pulses each time, these carrier pulses, given the existence of standard pulse code modulation (PCM), falling upon the respective signal appearing at the output of the demodulator DM and respectively forming a component portion of the information to be evaluated.

The plurality of the carrier pulses falling upon the terminating pulse which terminates the analog value transmission is selected greater than the plurality of carrier pulse which respectively fall upon the individual PCM pulses forming the code words to be transmitted. Moreover, it is seen that the transfer pulse Ü is transmitted only given the existence of a terminating pulse, in that only one sufficiently higher counter reading of the counter ZR is provided for the control of the AND gate U of the memory SP.

The differentiating element Df can be simplified for the present case, since it then only has the task of delaying the appearance of the reset pulses R for the counter Z until the transfer of pulse Ü cannot appear in time before the reset pulse triggered by means of the same terminating signal.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution of the art.

We claim:

1. A remote control system for controlling a plurality of controlled devices, comprising:
  a transmitting system for transmitting digital command code words identifying the controlled devices to be activated and analog information defining the degree of activation, said transmitter system including
    a code word generator operable to produce a digital code word followed by a digital signal,
    selection and activation means connected to said code word generator and operable to select the code words, the time interval between the code word and the digital signal and to activate said code word generator, and
    transmitting means connected to said code word generator for receiving and transmitting the digital and analog signals; and
  a receiving system for providing corresponding execution signals in response to the digital and analog signals, said receiving system including
    receiving means for receiving the digital and analog signals,
    decoding means connected to said receiving means for decoding the code words and providing a corresponding execution command, and
    analog sensing means connected to said receiving means and operable to produce a signal to terminate execution of the command.

2. The remote control system of claim 1, wherein said code generator is operable to produce two identical time-spaced code words as the code word and the digital signal.

3. The remote control system of claim 1, wherein said code generator is operable to produce a first code word followed by a single pulse as the digital signal.

4. The remote control system of claim 1, wherein said selection means comprises:
  a monoflop including an adjustable time constant circuit for selecting the time interval between the code word and the following digital signal; and
  said remote control system further comprising
  sequence control means connected to said selection and activation means and to said code word generator and operated in response to the end of a code word to operate said monoflop, said code word generator connected to and operated by said monoflop at the end of the selected time interval to produce said digital signal;
  a counter in said analog sensing means and activated by the end of a code word to count time up to the following digital signal; and
  a digital/analog converter connected to said counter for converting the count into a command termination signal.

5. The remote control system of claim 4, wherein said sequence control means comprises:
  a clock producing clock pulses;
  an AND gate;
  a multi-stage counter including serially connected stages, a counting input connected to said clock and a reset input, the outputs first and second stages connected to said AND gate, said AND gate including an output connected to activate said monoflop;
  inverter means;
  a NOR gate including a first input connected to the output of said monoflop, a second input connected to the output of said monoflop via said inverter means, and an output connected to said reset input of said multi-stage counter.

6. The remote control system of claim 5, comprising coding means in said transmitting system code generator connected to and activated by said monoflop.

7. The remote control system of claim 4, wherein said receiving system comprises:
  a digital differentiating circuit connected to said decoding means and operable to produce a reset signal and a transfer signal,
  said counter including a reset input connected to said differentiating circuit to receive said reset signal,
  memory means connected between said counter and said digital/analog converter and connected to said digital differentiating circuit to receive the transfer signal, and
  responsive to the transfer signal to store the content of said counter.

8. The remote control system of claim 7, wherein said memory means comprises:
  a multi-cell memory; and
  a plurality of AND gates each including an output connected to a respective memory cell, a first input connected to receive the transfer signal and a second input,
  said counter including a plurality of outputs each connected to a respective second input of an AND gate.

9. The remote control system of claim 8, wherein said digital differentiating circuit comprises:
  an AND gate having first and second inputs and an output;
  a NOR gate having first and second inputs and an output; and
  a delay circuit;
  said first inputs connected directly to said decoding means and said second inputs connected to said decoding means via said delay circuit.

* * * * *